(12) United States Patent
Hsu et al.

(10) Patent No.: US 7,910,467 B2
(45) Date of Patent: Mar. 22, 2011

(54) METHOD FOR TREATING LAYERS OF A GATE STACK

(75) Inventors: Yu-Rung Hsu, Tainan (TW); Chen-Hua Yu, Hsin-Chu (TW); Liang-Gi Yao, Shin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 3 days.

(21) Appl. No.: 12/355,401

(22) Filed: Jan. 16, 2009

(65) Prior Publication Data
US 2010/0184281 A1   Jul. 22, 2010

(51) Int. Cl.
*H01L 21/3205* (2006.01)
*H01L 21/4763* (2006.01)
*H01L 21/336* (2006.01)

(52) U.S. Cl. ........ 438/591; 438/287; 438/795; 438/798; 257/E21.409; 257/E21.347; 257/E21.495

(58) Field of Classification Search .................. 438/287, 438/591; 257/E21.409
See application file for complete search history.

(56) References Cited

U.S. PATENT DOCUMENTS

| | | | |
|---|---|---|---|
| 6,475,927 B1 * | 11/2002 | Thakur | 438/773 |
| 6,767,847 B1 | 7/2004 | Hu et al. | |
| 6,774,045 B1 * | 8/2004 | Liu et al. | 438/709 |
| 7,235,495 B2 * | 6/2007 | Wagener | 438/756 |
| 2008/0290393 A1 * | 11/2008 | Kakehata et al. | 257/316 |
| 2009/0065849 A1 * | 3/2009 | Noda | 257/324 |
| 2009/0163012 A1 * | 6/2009 | Clark et al. | 438/591 |

* cited by examiner

*Primary Examiner* — Angel Roman
(74) *Attorney, Agent, or Firm* — Haynes and Boone, LLP

(57) ABSTRACT

A method for fabricating a semiconductor device with improved performance is disclosed. The method comprises providing a semiconductor substrate; forming one or more gate stacks having an interfacial layer, a high-k dielectric layer, and a gate layer over the substrate; and performing at least one treatment on the interfacial layer, wherein the treatment comprises a microwave radiation treatment, an ultraviolet radiation treatment, or a combination thereof.

23 Claims, 4 Drawing Sheets

METHOD FOR TREATING LAYERS OF A GATE STACK

BACKGROUND

The semiconductor integrated circuit (IC) industry has experienced rapid growth. Technological advances in IC materials and design have produced generations of ICs where each generation has smaller and more complex circuits than the previous generation. These advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down also presents critical challenges for manufacturing and processing IC devices having gate stacks, such as reducing effective/equivalent oxide thickness while keeping gate leakage under control. Conventional processes are limited by interlayer diffusion and thermal budget concerns.

Accordingly, what is needed is a method for making a semiconductor device that addresses the above stated issues.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for only illustration purposes. In fact, the dimensions of the various features may be arbitrarily increased or reduced for clarity of discussion.

DETAILED DESCRIPTION

Figure 1:
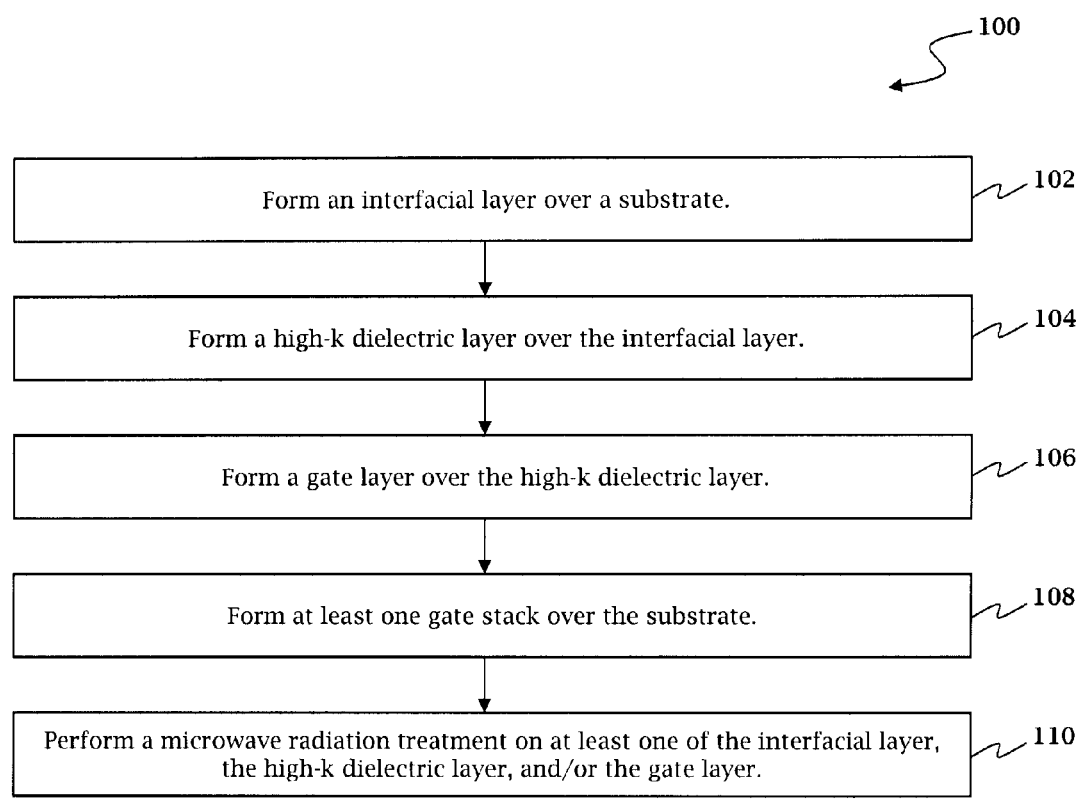
FIG. 1 is a flow chart of a method for fabricating a semiconductor device according to aspects of the present invention.

The present disclosure relates generally to methods for manufacturing semiconductor devices, and more particularly, to a method for manufacturing a semiconductor device that minimizes interlayer diffusion and thermal budget concerns.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2A:
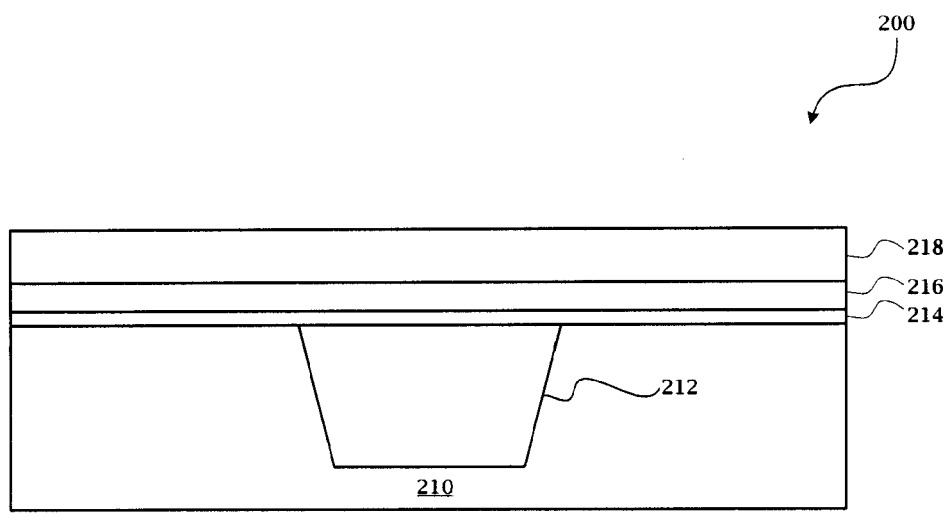
FIGS. 2A-2B are various cross-sectional views of embodiments of a semiconductor device during various fabrication stages according to the method of FIG. 1.
Figure 2B:
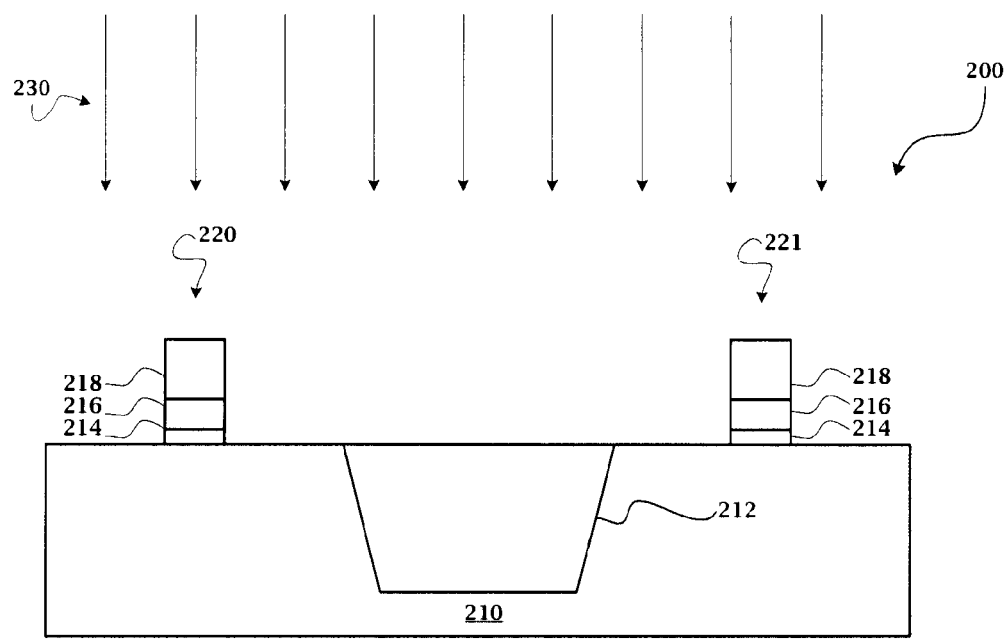
Figure 3:
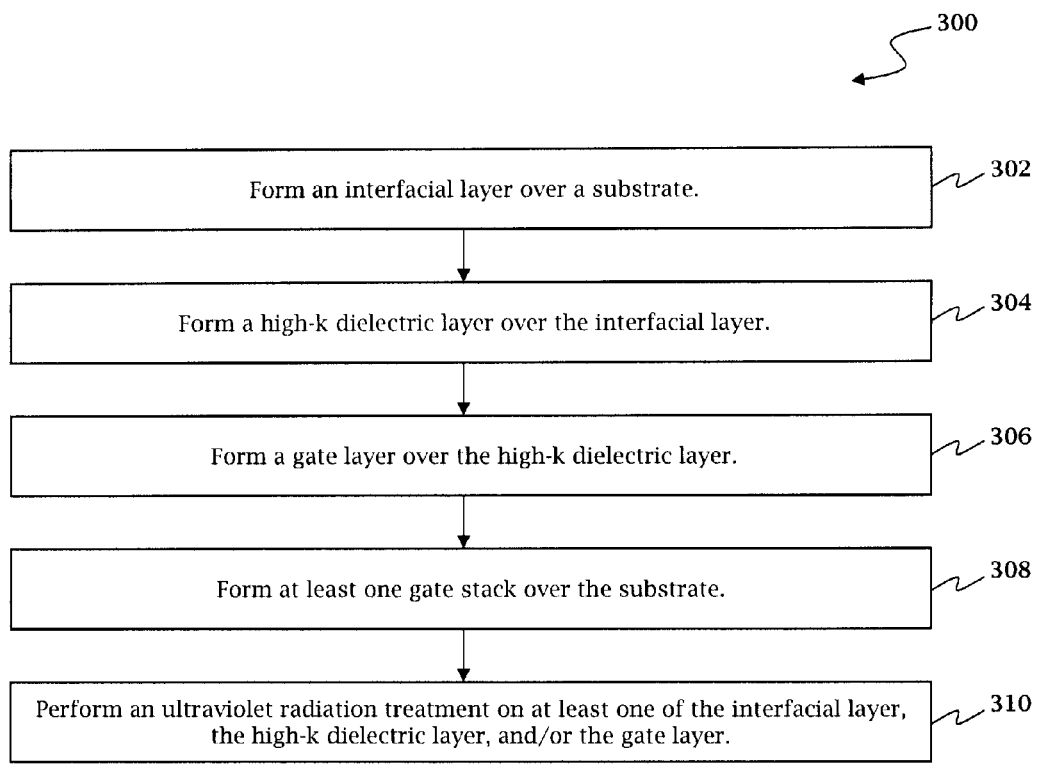
FIG. 3 is a flow chart of a method for fabricating a semiconductor device according to aspects of the present invention.
Figure 4A:
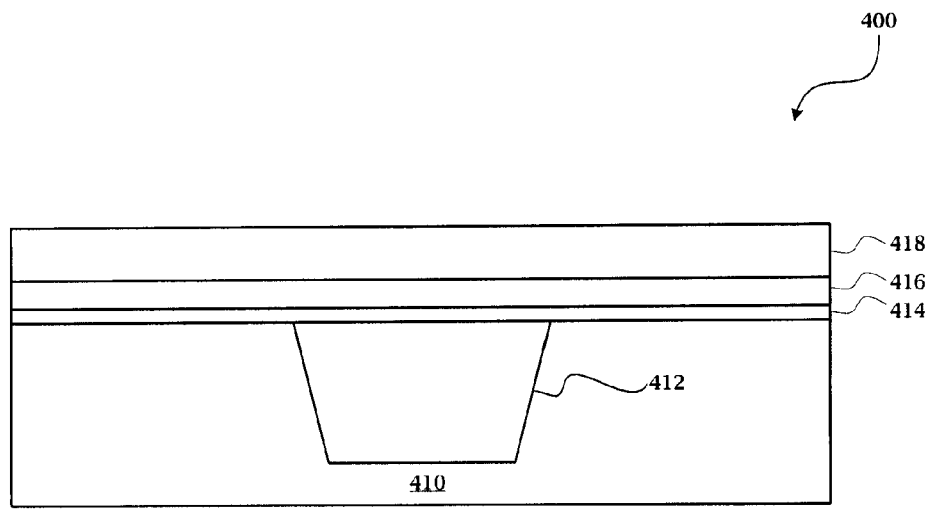
FIGS. 4A-4B are various cross-sectional views of embodiments of a semiconductor device during various fabrication stages according to the method of FIG. 3.
Figure 4B:
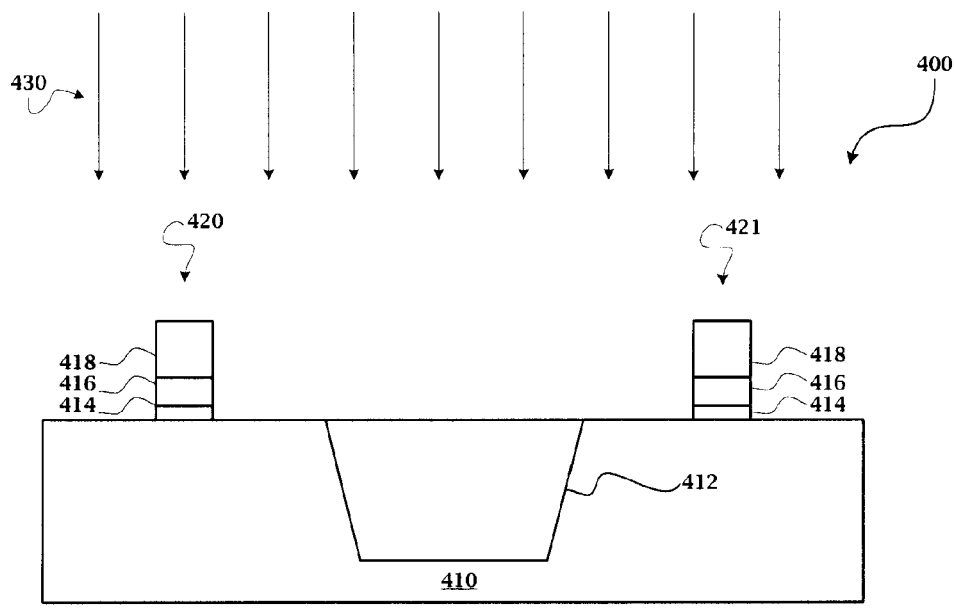

With reference to FIGS. 1 through 4B, methods 100, 300 and semiconductor devices 200, 400 are collectively described below. FIG. 1 is a flow chart of one embodiment of the method 100 for making the semiconductor device 200. FIGS. 2A-2B are various cross-sectional views of the semiconductor device 200 according to one embodiment, in portion or entirety, during various fabrication stages of the method 100. FIG. 3 is a flow chart of one embodiment of the method 300 for making the semiconductor device 400. FIGS. 4A-4B are various cross-sectional views of the semiconductor device 400 according to one embodiment, in portion or entirety, during various fabrication stages of the method 300. It is understood that additional steps can be provided before, during, and after the methods 100, 300, and some of the steps described below can be replaced or eliminated, for additional embodiments of the methods 100, 300. It is further understood that additional features can be added in the semiconductor devices 200, 400, and some of the features described below can be replaced or eliminated, for additional embodiments of the semiconductor devices 200, 400. The present embodiment of methods 100, 300 and semiconductor devices 200, 400 minimizes interlayer diffusion and addresses thermal budget concerns.

Referring to FIGS. 1 and 2A, the method 100 begins at step 102 wherein a substrate 210 including at least one isolation region 212 is provided, and an interfacial layer 214 is formed over the substrate 210. In the present embodiment, the substrate 210 is a semiconductor substrate. The semiconductor substrate 210 may comprise an elementary semiconductor including silicon or germanium in crystal, polycrystalline, or an amorphous structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epi layer or a buried layer. In other examples, the compound semiconductor substrate may have a multilayer structure, or the silicon substrate may include a multilayer compound semiconductor structure. In some embodiments, the substrate 210 may comprise a non-semiconductor material.

The substrate 210 may include various doping configurations depending on design requirements as known in the art. In some embodiments, the substrate 210 may include doped regions. The doped regions may be doped with p-type or n-type dopants. For example, the doped regions may be doped with p-type dopants, such as boron or $BF_2$; n-type dopants, such as phosphorus or arsenic; and/or combinations thereof. The doped regions may be formed directly on the semiconductor substrate, in a P-well structure, in a N-well structure, in a dual-well structure, or using a raised structure. The semiconductor substrate 210 may further include various active regions, such as regions configured for an N-type metal-oxide-semiconductor transistor device (referred to as an NMOS) and regions configured for a P-type metal-oxide-semiconductor transistor device (referred to as a PMOS). It is understood that the semiconductor device 200 may be formed by complementary metal-oxide-semiconductor (CMOS) technology processing, and thus some processes are not described in detail herein.

The at least one isolation region 212 may be formed on the substrate 210 to isolate various regions, for example, to isolate NMOS and PMOS transistor device regions. The isolation region 212 may utilize isolation technology, such as local oxidation of silicon (LOCOS) or shallow trench isolation (STI), to define and electrically isolate the various regions. In the present embodiment, the isolation region 212 includes a STI. The isolation region 212 may comprise silicon oxide, silicon nitride, silicon oxynitride, fluoride-doped silicate glass (FSG), a low-K dielectric material, other suitable materials, and/or combinations thereof. The isolation region 212, and in the present embodiment, the STI, may be formed by any suitable process. As one example, the formation of an STI may include patterning the semiconductor substrate by a conventional photolithography process, etching a trench in the substrate (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

The semiconductor device 200 further includes the interfacial layer 214 formed over the substrate 210. The interfacial layer 214 may be formed by any suitable process and any suitable thickness. For example, the interfacial layer 214 may include a grown $SiO_2$ layer. The interfacial layer 214 may further comprise SiON. In some embodiments, before the interfacial dielectric layer 214 is grown over the substrate 210, an HF-last pre-gate clean (e.g., utilizing an HF solution) may be applied to the substrate 210, and in some instances, followed by a second wet clean process to form a chemical oxide. In some embodiments, the interfacial layer 214 may be formed by rapid thermal oxidation.

At step 104, a high-k dielectric layer 216 is formed over the substrate 210, and in the present embodiment, over the interfacial layer 214. The high-k dielectric layer 216 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, other suitable high-k dielectric materials, and/or combinations thereof. The high-k dielectric layer 216 may be formed by any suitable process to any suitable thickness, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, plating, other suitable processes, and/or combinations thereof.

The method 100 proceeds to step 106 by forming a gate layer 218 over the substrate 210, or in the present embodiment, over the high-k dielectric layer 216. In some embodiments, the gate layer 218 may comprise a dielectric material, such as silicon-containing materials including polycrystalline silicon, silicon oxide, silicon nitride, silicon oxynitride, and silicon carbide; germanium-containing materials; hafnium oxide; zirconium oxide; titanium oxide; aluminum oxide; hafnium dioxide-alumina ($HfO_2$—$Al_2O_3$) alloy; other suitable dielectric materials; and/or combinations thereof. In some embodiments, the gate layer 218 comprises a conductive material, such as aluminum, copper, tungsten, titanium, tantalum, titanium nitride, tantalum nitride, nickel silicide, cobalt silicide, TaC, TaSiN, TaCN, TiAl, TiAlN, other suitable materials, and/or combinations thereof. Further, the gate layer 218 may be doped polycrystalline silicon with the same or different doping. The gate layer 218 may include work function layers, liner layers, interface layers, seed layers, adhesion layers, barrier layers, etc. For example, if a P-type work function metal (P-metal) for a PMOS device is desired, TiN, WN, or W may be used. On the other hand, if an N-type work function metal (N-metal) for NMOS devices is desired, TiAl, TiAlN, or TaCN, may be used. In some embodiments, the gate layer 218 may include doped-conducting metal oxide materials. The gate layer 218 may be formed by any suitable process to any suitable thickness, such as ALD, CVD, PVD, RPCVD, PECVD, MOCVD, sputtering, plating, other suitable processes, and/or combinations thereof. It is understood that the gate layer 218 may comprise one or materials, such a first material in a first region and a second material in a second region.

Referring to FIGS. 1 and 2B, at step 108, at least one gate stack is formed over the substrate 210, and in the present embodiment, gate stacks 220, 221 including interfacial layer 214, high-k dielectric layer 216, and gate layer 218 are formed over the substrate 210. The gate stacks 220, 221 may be formed by any suitable process. For example, the gate stacks 220, 221 may be formed by conventional deposition, photolithography patterning, and etching processes, and/or combinations thereof. The deposition processes may include PVD, CVD, ALD, PECVD, RPCVD, MOCVD, sputtering, plating, other suitable methods, and/or combinations thereof. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods such as maskless photolithography, electron-beam writing, ion-beam writing, and molecular imprint. The etching processes may include dry etching, wet etching, and/or other etching methods (e.g., reactive ion etching). The etching process may also be either purely chemical (plasma etching), purely physical (ion milling), and/or combinations thereof. It is understood that the gate stacks 220, 221 may be formed by any combination of the processes described above.

In one example, for patterning the gate stacks 220, 221, a layer of photoresist is formed over the gate layer 218 by a suitable process, such as spin-on coating, and then patterned to form a patterned photoresist feature by a proper lithography patterning method. The pattern of the photoresist can then be transferred by a dry etching process to the underlying layers (i.e., the interfacial layer 214, the high-k dielectric layer 216, and the gate layer 218) to form the metal gate stacks 220, 221 as shown in FIG. 2B. The photoresist layer may be stripped thereafter. In another example, a hard mask layer is formed over the gate layer 218; a patterned photoresist layer is formed on the hard mask layer; the pattern of the photoresist layer is transferred to the hard mask layer and then transferred to the gate layer to form the gate layer and dielectric layers of the gate structures. It is understood that the above examples do not limit the processing steps that may be utilized to form the gate stacks 220, 221. It is further understood that the at least one gate structures 220, 221 may comprise additional layers. For example, the at least one gate structures may comprise hard mask layers, interfacial layers, capping layers, diffusion/barrier layers, dielectric layers, metal layers, other suitable layers, and/or combinations thereof. Also, the semiconductor device 200 may include antireflective coating layers or bottom antireflective coating layers.

Typically, the semiconductor device 200 may undergo further CMOS or MOS technology processing to form various features known in the art. For example, gate sidewall spacers may be formed on both sides of the gate stacks 220, 221 by a deposition and etching process. In some embodiments, lightly doped regions (referred to as LDD regions) may be formed in the substrate 210 using any suitable process, such as ion implantation, and any suitable dopants. In another example, source and drain regions (referred to as S/D regions) may be formed in the substrate 210 using ion implantation or diffusion with suitable dopants (depending on the configuration of the device such as NMOS and PMOS) and located proximate to each end of the gate stacks 220, 221, respectively. In still another example, various contacts/vias and multilayer interconnect features (e.g., metal layers and interlayer dielectrics) may be formed on the substrate 210 and configured to connect the various features or structures of the semiconductor device 200.

Such subsequent processing, particularly conventional heating processes (i.e., thermal energy processes), is limited by interlayer diffusion, thermal budget, and surface temperature concerns. When manufacturing devices having high-k/metal gate stacks, a trade-off occurs between providing sufficient energy for annealing the gate stacks' layers and preventing interlayer diffusion. The annealing processes typically require higher temperatures for preferably longer lengths of time, while maintaining the functionality of the gate stacks requires lower temperatures for shorter lengths of time. For example, next generation devices require thermal treatments with a temperature ranging between about 1200° C. and 1300° C., however, the gate stacks of such devices can withstand temperatures over about 600° C. for only a few milliseconds. Current rapid thermal processes (RTP) and laser processes are hardly able to meet the low thermal budget requirements for next generation devices. Essentially, the interlayer diffusion problems of gate stacks with ultra-thin thicknesses has created a bottleneck for thermal processes.

Accordingly, a microwave radiation treatment is introduced into the processing sequence of semiconductor devices and is applied to the gate stacks of the semiconductor devices. By applying a microwave radiation treatment, electromagnetic waves oscillate molecules of a target material, uniformly heating the entire volume of the target material from within (i.e., volumetrically heating, which is especially important as devices are trending towards 32 nm technology and below). Absorption of the microwave energy depends strongly on the intrinsic properties (e.g., a dielectric loss factor) of the material. Thus, the microwave energy will only be absorbed at the target layer, and various materials and/or layers may be selectively treated by tuning the microwave frequency band. When tuned to a particular microwave frequency, the microwave energy will be absorbed at only the target layer of the gate stack, while the other layers in the gate stack remain unaffected. Utilizing the microwave radiation treatment, minimizes interlayer diffusion and thermal budget concerns, particularly in high-k/metal gate devices. The treatment further maintains functional concentration profiles of the layers in the gate stacks and enhances effective oxide thickness (EOT) control.

In the present embodiment, at step 110, a microwave radiation treatment 230 is performed on the gate stacks 220, 221, specifically a microwave radiation treatment is performed on at least one of the interfacial layer 214, high-k dielectric layer 216, and/or the gate layer 218. The microwave radiation treatment 230 may comprise any suitable frequency and any suitable power output, and typically, the frequency utilized depends on which layer of the gate stacks 220, 221 is the target layer. For example, if the target layer is the interfacial layer 214, the microwave radiation treatment 230 may comprise a frequency of about 90 gigahertz (GHz) at about 1 kilowatt (kW) power output; if the target layer is the high-k dielectric layer 216, the microwave radiation treatment 230 may comprise a frequency of about 24 GHz at about 5 kW power output; and if the target layer is the gate layer 218, the microwave radiation treatment 230 may comprise a frequency of about 2.54 GHz at about 5 kW power output. In these examples, the interfacial layer 214 may comprise a chemical oxide, the high-k dielectric layer 216 may comprise hafnium oxide, and the gate layer 218 may comprise TiN. In one example, a microwave radiation treatment comprising a frequency of about 2.54 GHz at about 1 kW power on a In—ZnO film removed all organic residue without film recrystallization, which is virtually impossible for conventional RTP processes.

It is understood that the microwave radiation treatment 230 may comprise one or more microwave radiation treatments. For example, the microwave radiation treatment 230 may comprise, alone or in combination, a treatment of the interfacial dielectric layer 214, a treatment of the high-k dielectric layer 216, and/or a treatment of the gate layer 218. It is further understood that the microwave radiation treatment 230 may be performed at any time during the processing of the semiconductor device 200. In some embodiments, the microwave radiation treatment may be performed after the interfacial layer 214 is formed. In some embodiments, the microwave radiation treatment may be performed after the interfacial layer 214 and high-k dielectric layer 216 is formed. In some embodiments, the microwave radiation treatment 230 may be performed after the interfacial layer 214, high-k dielectric layer 216, and gate layer 218 are formed, but before the gate stacks are formed. In still other embodiments, gate stacks comprising various combinations of the layers and materials described herein may be formed, and then, the microwave radiation treatment 230 may be performed.

Referring to FIGS. 3 and 4A, the method 300 begins at step 302 wherein a substrate 410 including at least one isolation region 412 is provided, and an interfacial layer 414 is formed over the substrate 410. In the present embodiment, the substrate 410 is a semiconductor substrate. The semiconductor substrate 410 may comprise an elementary semiconductor including silicon or germanium in crystal, polycrystalline, or an amorphous structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained.

Furthermore, the semiconductor substrate may be a semiconductor on insulator, such as a silicon on insulator (SOI), or a thin film transistor (TFT). In some examples, the semiconductor substrate may include a doped epi layer or a buried layer. In other examples, the compound semiconductor substrate may have a multilayer structure, or the silicon substrate may include a multilayer compound semiconductor structure. In some embodiments, the substrate 410 comprises a non-semiconductor material.

The substrate 410 may include various doping configurations depending on design requirements as known in the art. In some embodiments, the substrate 410 may include doped regions. The doped regions may be doped with p-type or n-type dopants. For example, the doped regions may be doped with p-type dopants, such as boron or $BF_2$; n-type dopants, such as phosphorus or arsenic; and/or combinations thereof. The doped regions may be formed directly on the semiconductor substrate, in a P-well structure, in a N-well structure, in a dual-well structure, or using a raised structure. The semiconductor substrate 410 may further include various active regions, such as regions configured for an N-type metal-oxide-semiconductor transistor device (referred to as an NMOS) and regions configured for a P-type metal-oxide-semiconductor transistor device (referred to as a PMOS). It is understood that the semiconductor device 400 may be formed by complementary metal-oxide-semiconductor (CMOS) technology processing, and thus some processes are not described in detail herein.

The at least one isolation region 412 may be formed on the substrate 410 to isolate various regions, for example, to isolate NMOS and PMOS transistor device regions. The isolation region 412 may utilize isolation technology, such as local oxidation of silicon (LOCOS) or shallow trench isolation (STI), to define and electrically isolate the various regions. In the present embodiment, the isolation region 412 includes a STI. The isolation region 412 may comprise silicon oxide, silicon nitride, silicon oxynitride, fluoride-doped silicate glass (FSG), a low-K dielectric material, other suitable materials, and/or combinations thereof. The isolation region 412, and in the present embodiment, the STI, may be formed by any suitable process. As one example, the formation of an STI may include patterning the semiconductor substrate by a conventional photolithography process, etching a trench in the substrate (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

The semiconductor device 400 further includes the interfacial layer 414 formed over the substrate 410. The interfacial layer 414 may be formed by any suitable process and any suitable thickness. For example, the interfacial layer 414 may include a grown $SiO_2$ layer. The interfacial layer 414 may further comprise SiON. In some embodiments, before the interfacial dielectric layer 414 is grown over the substrate 410, an HF-last pre-gate clean (e.g., utilizing an HF solution) may be performed to get a fresh, clean substrate surface. The interfacial layer 414 may be a chemical oxide, which oxide is grown on the substrate surface during a wet cleaning process and/or rinsing operation, such as a RCA clean wafer cleaning solution comprising an APM (ammonia/hydrogen peroxide mixture) solution and/or a $H_4OH$ and $H_2O_2$ solution (SC1); an IMEC clean, a $DIW-O_3$ based clean (a cleaning solution comprising dissolved ozone and de-ionized water); and/or other suitable processes/operations, such as in-situ/ex-situ radiation processes. The interfacial layer 414 may be a thermal oxide and/or oxynitride, wherein a native oxide of the substrate is formed through oxidation of the substrate's surface at an elevated temperature, such as rapid thermal oxidation. In some embodiments, the interfacial layer 414 is formed by growing a thermal oxide layer and etching back. In some embodiments, the interfacial layer 414 is formed by growing a chemical oxide layer and etching back. In some embodiments, the ISSG (in-situ steam generation) oxidation of the substrate surface may be utilized to form the interfacial layer 414 comprising an ISSG oxide. In some embodiments, the interfacial layer 414 may comprise a UV-grown oxide. In the present embodiment, the interfacial layer 414 comprises a chemical oxide resulting from cleaning the substrate 410 with a $DIW-O_3$ solution (e.g., saturated ozonated oxide).

At step 304, a high-k dielectric layer 416 is formed over the substrate 410, and in the present embodiment, over the interfacial layer 414. The high-k dielectric layer 416 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, other suitable high-k dielectric materials, and/or combinations thereof. The high-k dielectric layer 416 may be formed by any suitable process to any suitable thickness, such as ALD, CVD, PVD, RPCVD, PECVD, MOCVD, sputtering, plating, other suitable processes, and/or combinations thereof.

The method 300 proceeds to step 306 by forming a gate layer 418 over the substrate 410, or in the present embodiment, over the high-k dielectric layer 416. In some embodiments, the gate layer 418 may comprise a dielectric material, such as silicon-containing materials including polycrystalline silicon, silicon oxide, silicon nitride, silicon oxynitride, and silicon carbide; germanium-containing materials; hafnium oxide; zirconium oxide; titanium oxide; aluminum oxide; hafnium dioxide-alumina ($HfO_2$—$Al_2O_3$) alloy; other suitable dielectric materials; and/or combinations thereof. In some embodiments, the gate layer 418 comprises a conductive material, such as aluminum, copper, tungsten, titanium, tantalum, titanium nitride, tantalum nitride, nickel silicide, cobalt silicide, TaC, TaSiN, TaCN, TiAl, TiAlN, other suitable materials, and/or combinations thereof. Further, the gate layer 418 may be doped polycrystalline silicon with the same or different doping. The gate layer 418 may include work function layers, liner layers, interface layers, seed layers, adhesion layers, barrier layers, etc. For example, if a P-type work function metal (P-metal) for a PMOS device is desired, TiN, WN, or W may be used. On the other hand, if an N-type work function metal (N-metal) for NMOS devices is desired, TiAl, TiAlN, or TaCN, may be used. In some embodiments, the gate layer 418 may include doped-conducting metal oxide materials. The gate layer 418 may be formed by any suitable process to any suitable thickness, such as ALD, CVD, PVD, RPCVD, PECVD, MOCVD, sputtering, plating, other suitable processes, and/or combinations thereof. It is understood that the gate layer 418 may comprise one or materials, such a first material in a first region and a second material in a second region.

Referring to FIGS. 3 and 4B, at step 308, at least one gate stack is formed over the substrate 410, and in the present embodiment, gate stacks 420, 421 including interfacial layer 414, high-k dielectric layer 416, and gate layer 418 are formed over the substrate 410. The gate stacks 420, 421 may be formed by any suitable process. For example, the gate stacks 420, 421 may be formed by conventional deposition, photolithography patterning, and etching processes, and/or combinations thereof. The deposition processes may include PVD, CVD, ALD, PECVD, RPCVD, MOCVD, sputtering, plating, other suitable methods, and/or combinations thereof. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. The photolithography exposing process may also be implemented or replaced by other proper methods such as maskless photolithography, electron-beam writing, ion-beam writing, and molecular imprint. The etching processes may include dry etching, wet etching, and/or other etching methods (e.g., reactive ion etching). The etching process may also be either dry etching (plasma etching), wet etching, and/or combinations thereof. It is understood that the gate stacks 420, 421 may be formed by any combination of the processes described above.

In one example, for patterning the gate stacks 420, 421, a layer of photoresist is formed over the gate layer 418 by a suitable process, such as spin-on coating, and then patterned to form a patterned photoresist feature by a proper lithography patterning method. The pattern of the photoresist can then be transferred by a dry etching process to the underlying layers (i.e., the interfacial layer 414, the high-k dielectric layer 416, and the gate layer 418) to form the metal gate stacks 420, 421 as shown in FIG. 4B. The photoresist layer may be stripped thereafter. In another example, a hard mask layer is formed over the gate layer 418; a patterned photoresist layer is formed on the hard mask layer; the pattern of the photoresist layer is transferred to the hard mask layer and then transferred to the gate layer to form the gate layer and dielectric layers of the gate structures. It is understood that the above examples do not limit the processing steps that may be utilized to form the gate stacks 420, 421. It is further understood that the at least one gate structures 420, 421 may comprise additional layers. For example, the at least one gate structures may comprise hard mask layers, interfacial layers, capping layers, diffusion/barrier layers, dielectric layers, metal layers, other suitable layers, and/or combinations thereof. Also, the semiconductor device 400 may include antireflective coating layers or bottom antireflective coating layers.

Typically, the semiconductor device 400 may undergo further CMOS or MOS technology processing to form various features known in the art. For example, gate sidewall spacers may be formed on both sides of the gate stacks 420, 421 by a deposition and etching process. In some embodiments, lightly doped regions (referred to as LDD regions) may be formed in the substrate 410 using any suitable process, such as ion implantation, and any suitable dopants. In another example, source and drain regions (referred to as S/D regions) may be formed in the substrate 410 using ion implantation or diffusion with suitable dopants (depending on the configuration of the device such as NMOS and PMOS) and located proximate to each end of the gate stacks 420, 421, respectively. In still another example, various contacts/vias and multilayer interconnect features (e.g., metal layers and interlayer dielectrics) may be formed on the substrate 410 and configured to connect the various features or structures of the semiconductor device 400.

As noted above, such subsequent processing, particularly conventional heating processes (i.e., thermal energy processes), is limited by interlayer diffusion, thermal budget, and surface temperature concerns. Particularly, implementing high-k dielectric layers into integrated circuit devices, such as the semiconductor device 400, requires an ultra-thin interfacial layer (i.e., the interfacial layer 414) to resolve poor interfacial quality between the high-k dielectric layer and the substrate. It has been observed that providing an ultra-thin interfacial layer exhibiting an acceptable quality while preventing (and/or controlling) its re-growth rate during subsequent processing presents difficulties. Further, as device size continues to decrease to smaller technology nodes, such as 32 nm technology nodes and beyond, scaling down the EOT while keeping gate leakage under control becomes a critical challenge.

Accordingly, an ultraviolet (UV) radiation treatment is introduced into the processing sequence of semiconductor devices and is applied to the gate regions or gate stacks of the semiconductor devices. By applying a UV radiation treatment, electromagnetic waves oscillate molecules of a target material, providing energies for atomic level structure relaxation and heating the material as a result of electron exciting. Absorption of the UV energy depends strongly on the intrinsic properties, such as a band gap, of the material. Thus, the UV energy will only be effectively absorbed at the target layer, and various materials and/or layers may be selectively treated. The UV energy may be tuned for maximum absorption in a given material (or target layer). Utilizing the UV radiation treatment effectively densifies the interfacial layer and minimizes interlayer diffusion and thermal budget concerns, particularly in high-k/metal gate devices. The UV treatment further ensures maximum absorption efficiency of the interfacial layer and enhances EOT control/scaling down.

At step 310, a UV radiation treatment 430 is performed on the gate stacks 420, 421, specifically a UV radiation treatment is performed on at least one of the interfacial layer 414, high-k dielectric layer 416, and/or the gate layer 418. In the present embodiment, the UV radiation treatment is performed on the interfacial layer 414, which as noted above comprises a chemical oxide. In some embodiments, the interfacial layer 414 comprising the chemical oxide is etched back utilizing an ultra-dilute HF solution or HF vapor etching process before and/or after the UV radiation treatment 430. The HF vapor etching process minimizes $H_2O$ enhanced pin-hole formation and avoids $H_2O$ enhanced oxide re-growth during subsequent processing. In some embodiments, the interfacial layer 414 is etched back by the HF vapor etching process to a thickness ranging between about 4 Å and 6 Å.

It has been observed that a single band, or shorter band (e.g., 185 nm and shorter), UV radiation treatment, under an oxygen-contained ambient environment, on the interfacial layer 414 dissociates $O_2$ and creates ozone and oxygen radicals, which react with silicon to form silicon oxide, therefore undesirably increasing the thickness of the interfacial layer 414. Further, in shorter/single band UV radiation treatments, Si—O—Si bridges may break due to higher photo energies. Thus, in the present embodiments, the UV radiation treatment 430 comprises broadband (e.g., H or H+ spectrum) UV radiation. Utilizing a broadband UV radiation treatment minimizes the creation of non-bridging oxygen hole centers (NBOHC, an oxygen dangling bond); maximizes and/or improves UV absorption efficiency; suppresses the re-growth rate of the interfacial layer; enhances oxide restore efficiency; enhances EOT scaling down; and/or restores Si—O—Si bridging by dissociating Si—H, hydroxyl groups, and trapped water molecules. The UV radiation treatment also effectively addresses thermal budget concerns. For example, a ten minute, low temperature UV radiation treatment is equivalent to a 900° C. rapid thermal anneal treatment.

The broadband UV radiation treatment comprises wavelengths ranging from about 200 nm to about 600 nm. The UV radiation treatment 430 may further utilize any suitable power output. As opposed to conventional processing (which utilizes low power outputs, such as milliwatt power outputs), the UV radiation treatment 430 may utilize a power output ranging from milliwatt levels to about 5 watts. The UV radiation treatment 430 may be performed in any suitable ambient, such as an ambient comprising oxygen ($O_2$), argon, nitrogen ($N_2$), NO, $NH_3$, and/or combinations thereof. The broadband UV radiation treatment essentially provides control/tuning power over UV absorption, UV power, ambients, and temperature. The UV radiation treatment 430 may be performed for any suitable amount of time, and it has been observed that condensation of the interfacial layer depends linearly on UV radiation treatment time. It should be noted that the UV radiation treatment 430 may be performed in-situ. So, essentially, a pre-clean of the substrate 410, interfacial layer 414 growth and/or formation, and UV radiation treatment 430 may be accomplished in a single processing tool. Such in-situ treatment in a cleaning tool minimizes AMC (airborne molecular contaminate) and queue time concerns.

It is understood that the UV radiation treatment 430 may comprise one or more UV radiation treatments. For example, the UV radiation treatment 430 may comprise, alone or in combination, a treatment of the interfacial dielectric layer 414, a treatment of the high-k dielectric layer 416, and/or a treatment of the gate layer 418. It is further understood that the UV radiation treatment 430 may be performed at any time during the processing of the semiconductor device 400. In some embodiments, the UV radiation treatment may be performed after the interfacial layer 414 is formed. In some embodiments, the UV radiation treatment may be performed after the interfacial layer 414 and high-k dielectric layer 416 is formed. In some embodiments, the UV radiation treatment 430 may be performed after the interfacial layer 414, high-k dielectric layer 416, and gate layer 418 are formed, but before the gate stacks are formed. In still other embodiments, gate stacks comprising various combinations of the layers and materials described herein may be formed, and then, the UV radiation treatment 430 may be performed.

In summary, for EOT scaling down of integrated circuit devices, particularly high-k/metal gate devices, an ultra-thin interfacial layer is essential to enhance the devices' electrical performance. Accordingly, the present embodiments provide an interfacial layer comprising a thin layer of a chemical oxide, resulting from a pre-gate clean, which is subsequently treated with a microwave radiation treatment and/or an ultraviolet radiation treatment. The microwave radiation treatment and/or ultraviolet radiation treatment shrinks the thickness of the interfacial layer and densifies the interfacial layer, which benefits EOT scaling down and reduces leakage. The disclosed embodiments improve overall device performance.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating an integrated circuit, the method comprising:
   providing a substrate;
   forming an interfacial layer over the substrate;
   forming a high-k dielectric layer over the interfacial layer;
   forming a gate layer over the high-k dielectric layer;
   forming at least one gate stack over the substrate; and
   after forming the at least one gate stack, performing a microwave treatment on the interfacial layer.

2. The method of claim 1 wherein performing the microwave treatment comprises selectively treating the interfacial layer.

3. The method of claim 2 wherein selectively treating the interfacial layer comprises utilizing a microwave radiation having a frequency of about 90 GHz at a power output of about 1 kW.

4. The method of claim 2 wherein the interfacial layer comprises a chemical oxide.

5. The method of claim 1 wherein performing the microwave treatment comprises selectively treating the high-k dielectric layer.

6. The method of claim 5 wherein treating the high-k dielectric layer comprises utilizing a microwave radiation having a frequency of about 24 GHz at a power output of about 5 kW.

7. The method of claim 1 wherein performing the microwave treatment comprises treating the gate layer.

8. The method of claim 7 wherein treating the gate layer comprises utilizing a microwave radiation having a frequency of about 2.54 GHz at a power output of about 5 kW.

9. A method for fabricating an integrated circuit, the method comprising:
   providing a substrate;
   forming an interfacial layer over the substrate;
   forming a high-k dielectric layer over the interfacial layer;
   forming a gate layer over the high-k dielectric layer;
   forming at least one gate stack over the substrate; and
   after forming the at least one gate stack, performing a broadband ultraviolet (UV) treatment on the interfacial layer.

10. The method of claim 9 wherein performing the broadband UV treatment comprises selectively treating the interfacial layer.

11. The method of claim 10 wherein the interfacial layer comprises a chemical oxide.

12. The method of claim 10 further comprising etching back the interfacial layer over the substrate.

13. The method of claim 12 wherein etching back the interfacial layer over the substrate comprises utilizing an HF vapor etching process.

14. The method of claim 12 wherein etching back the interfacial layer over the substrate comprises etching back the interfacial layer to a thickness ranging from about 4 Å and about 6 Å.

15. The method of claim 10 further comprising, in-situ, pre-cleaning the substrate, forming the interfacial layer over the substrate, and selectively treating the interfacial layer.

16. The method of claim 9 wherein performing the broadband UV treatment comprises performing the broadband UV treatment in an ambient comprising oxygen ($O_2$), argon, nitrogen (Ni), NO, $NH_3$, and/or combinations thereof.

17. The method of claim 9 wherein performing the broadband UV radiation treatment comprises utilizing an power output ranging from milliwatts to about 5 watts.

18. A method for fabricating an integrated circuit, wherein the integrated circuit comprises one or more gate stacks having an interfacial layer, a high-k dielectric layer, and a gate layer, the method comprising:
   providing a semiconductor substrate;
   forming the one or more gate stacks having the interfacial layer, the high-k dielectric layer, and the gate layer over the substrate; and
   thereafter, performing at least one treatment on the interfacial layer, wherein the treatment comprises a microwave radiation treatment, an ultraviolet radiation treatment, or a combination thereof.

19. The method of claim 18 wherein forming the interfacial layer comprises performing a pre-gate clean to form a thin chemical oxide layer.

20. The method of claim 18 wherein forming the interfacial layer comprises etching back the interfacial layer over the substrate utilizing an HF vapor etching process.

21. A method for fabricating an integrated circuit, wherein the integrated circuit comprises one or more gate stacks having an interfacial layer, a high-k dielectric layer, and a gate layer, the method comprising:

providing a semiconductor substrate;

forming the one or more gate stacks having the interfacial layer, the high-k dielectric layer, and the gate layer over the substrate; and selectively performing at least one treatment on the interfacial layer, the high-k dielectric layer, or the gate layer, wherein the treatment comprises a microwave radiation treatment, an ultraviolet radiation treatment, or a combination thereof; and wherein the treatment maintains a functional concentration profile of the treated layer.

22. The method of claim 21 wherein the at least one treatment is a microwave treatment treating the interfacial layer.

23. The method of claim 21 wherein the at least one treatment is an ultraviolet treatment treating the interfacial layer.

\* \* \* \* \*